(12) United States Patent
Chou et al.

(10) Patent No.: US 9,786,628 B2
(45) Date of Patent: *Oct. 10, 2017

(54) AIR TRENCH IN PACKAGES INCORPORATING HYBRID BONDING

(71) Applicant: Taiwan Semiconductor Manufacturing Company, Ltd., Hsin-Chu (TW)

(72) Inventors: Bruce C. S. Chou, Hsin-Chu (TW); Chen-Jong Wang, Bao-Shan (TW); Ping-Yin Liu, Yonghe (TW); Jung-Kuo Tu, Hsin-Chu (TW); Tsung-Te Chou, Taipei (TW); Xin-Hua Huang, Xihu Township (TW); Hsun-Chung Kuang, Hsin-Chu (TW); Lan-Lin Chao, Sindian (TW); Chia-Shiung Tsai, Hsin-Chu (TW); Xiaomeng Chen, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/356,887

(22) Filed: Nov. 21, 2016

(65) Prior Publication Data

US 2017/0069593 A1 Mar. 9, 2017

Related U.S. Application Data

(63) Continuation of application No. 15/042,268, filed on Feb. 12, 2016, now Pat. No. 9,502,396, which is a
(Continued)

(51) Int. Cl.
*H01L 23/00* (2006.01)
*H01L 23/498* (2006.01)
(Continued)

(52) U.S. Cl.
CPC .......... *H01L 24/80* (2013.01); *H01L 21/3081* (2013.01); *H01L 21/764* (2013.01);
(Continued)

(58) Field of Classification Search
CPC ....... H01L 23/498; H01L 24/93; H01L 24/05; H01L 24/08; H01L 24/80; H01L 23/5226;
(Continued)

(56) References Cited

U.S. PATENT DOCUMENTS 6,307,755 B1 10/2001 Williams et al.
8,053,277 B2 11/2011 Yu et al.
(Continued)

OTHER PUBLICATIONS

Tan, C.S., et al., "Observation of interfacial void formation in bonded copper layers," AIP Applied Physics Letters, 87, 201909, Jun. 20, 2005, 4 pages.

*Primary Examiner* — Roy Potter
(74) *Attorney, Agent, or Firm* — Slater Matsil, LLP

(57) ABSTRACT

A package component includes a surface dielectric layer including a planar top surface, a metal pad in the surface dielectric layer and including a second planar top surface level with the planar top surface, and an air trench on a side of the metal pad. The sidewall of the metal pad is exposed to the air trench.

20 Claims, 6 Drawing Sheets

Related U.S. Application Data continuation of application No. 13/895,122, filed on May 15, 2013, now Pat. No. 9,443,796.

(60) Provisional application No. 61/793,355, filed on Mar. 15, 2013.

(51) Int. Cl.
| | | |
|---|---|---|
| *H01L 23/522* | (2006.01) | |
| *H01L 21/308* | (2006.01) | |
| *H01L 21/764* | (2006.01) | |
| *H01L 25/00* | (2006.01) | |
| *H01L 25/065* | (2006.01) | |
| H01L 23/532 | (2006.01) | |

(52) U.S. Cl.
CPC ........ *H01L 23/498* (2013.01); *H01L 23/5226* (2013.01); *H01L 23/53228* (2013.01); *H01L 23/53295* (2013.01); *H01L 24/03* (2013.01); *H01L 24/05* (2013.01); *H01L 24/06* (2013.01); *H01L 24/08* (2013.01); *H01L 24/09* (2013.01); *H01L 24/83* (2013.01); *H01L 24/93* (2013.01); *H01L 25/0657* (2013.01); *H01L 25/50* (2013.01); H01L 23/5329 (2013.01); H01L 23/53204 (2013.01); H01L 2224/03845 (2013.01); H01L 2224/05554 (2013.01); H01L 2224/05571 (2013.01); H01L 2224/05647 (2013.01); H01L 2224/0601 (2013.01); H01L 2224/08147 (2013.01); H01L 2224/0901 (2013.01); H01L 2224/80895 (2013.01); H01L 2224/80896 (2013.01); H01L 2225/06524 (2013.01); H01L 2924/00011 (2013.01); H01L 2924/01322 (2013.01); H01L 2924/351 (2013.01)

(58) Field of Classification Search
CPC . H01L 23/53295; H01L 25/50; H01L 21/764; H01L 21/3081; H01L 24/06; H01L 24/09; H01L 24/83; H01L 23/53228; H01L 24/03; H01L 2224/05554; H01L 2224/05571; H01L 2224/05647; H01L 2224/80895; H01L 2224/80896; H01L 23/53204; H01L 23/5329; H01L 2224/08147; H01L 2924/351; H01L 2924/01322; H01L 2224/0601; H01L 2224/03845; H01L 2924/00014; H01L 2924/00012; H01L 2924/00; H01L 2924/00011; H01L 2224/81805; H01L 29/408; H01L 29/2003; H01L 29/205; H01L 29/7787; H01L 29/66462
See application file for complete search history.

(56) References Cited

U.S. PATENT DOCUMENTS

| | | | |
|---|---|---|---|
| 8,525,354 | B2 | 9/2013 | Wu et al. |
| 8,802,538 | B1 | 8/2014 | Liu et al. |
| 9,312,229 | B2 | 4/2016 | Chen et al. |
| 9,443,796 | B2 * | 9/2016 | Chou .................... H01L 23/498 |
| 2002/0163072 | A1 | 11/2002 | Gupta et al. |
| 2003/0193076 | A1 | 10/2003 | Patti |
| 2004/0248401 | A1 | 12/2004 | Satake et al. |
| 2005/0161795 | A1 | 7/2005 | Tong et al. |
| 2006/0151887 | A1 | 7/2006 | Oh et al. |
| 2008/0006938 | A1 | 1/2008 | Patti et al. |
| 2009/0124172 | A1 | 5/2009 | Uchikura et al. |
| 2009/0176372 | A1 | 7/2009 | Minamihaba et al. |
| 2010/0258890 | A1 | 10/2010 | Ahn |
| 2011/0084403 | A1 | 4/2011 | Yang et al. |
| 2012/0094469 | A1 | 4/2012 | Landru |
| 2013/0009321 | A1 | 1/2013 | Kagawa et al. |
| 2013/0020704 | A1 | 1/2013 | Sadaka |
| 2013/0207268 | A1 | 8/2013 | Chapelon |
| 2013/0320556 | A1 | 12/2013 | Liu et al. |
| 2014/0015088 | A1 | 1/2014 | Chapelon |
| 2014/0117546 | A1 | 5/2014 | Liu et al. |
| 2014/0175614 | A1 | 6/2014 | Wang et al. |
| 2014/0175655 | A1 | 6/2014 | Chen et al. |
| 2014/0339698 | A1 | 11/2014 | Cassidy et al. |
| 2015/0364434 | A1 | 12/2015 | Chen et al. |

\* cited by examiner ically melted. When the melted eutectic materials are solidified, the wafers are bonded together. In the direct metal-to-metal bonding, two metal pads are pressed against each other at an elevated temperature, and the inter-diffusion of the metal pads causes the bonding of the metal pads. In the hybrid bonding, the metal pads of two wafers are bonded to each other through direct metal-to-metal bonding, and an oxide surface of one of the two wafers is bonded to an oxide surface or a silicon surface of the other wafer.

AIR TRENCH IN PACKAGES INCORPORATING HYBRID BONDING

PRIORITY CLAIM AND CROSS-REFERENCE

This application is a continuation of U.S. patent application Ser. No. 15/042,268, entitled "Air Trench in Packages Incorporation Hybrid Bonding," filed Feb. 12, 2016, which application is a divisional of U.S. patent application Ser. No. 13/895,122, entitled "Air Trench in Packages Incorporation Hybrid Bonding," filed May 15, 2013, now U.S. Pat. No. 9,443,796, issued Sep. 13, 2016, which application claims the benefit of U.S. Provisional Application No. 61/793,355, filed Mar. 15, 2013, and entitled "Air Trench in Packages Incorporating Hybrid Bonding," which applications are hereby incorporated herein by reference.

BACKGROUND

In wafer-to-wafer bonding technology, various methods have been developed to bond two package components (such as wafers) together. The available bonding methods include fusion bonding, eutectic bonding, direct metal bonding, hybrid bonding, and the like. In the fusion bonding, an oxide surface of a wafer is bonded to an oxide surface or a silicon surface of another wafer. In the eutectic bonding, two eutectic materials are placed together, and are applied with a high pressure and a high temperature. The eutectic materials are hence melted. When the melted eutectic materials are solidified, the wafers are bonded together. In the direct metal-to-metal bonding, two metal pads are pressed against each other at an elevated temperature, and the inter-diffusion of the metal pads causes the bonding of the metal pads. In the hybrid bonding, the metal pads of two wafers are bonded to each other through direct metal-to-metal bonding, and an oxide surface of one of the two wafers is bonded to an oxide surface or a silicon surface of the other wafer.

The previously developed bonding methods have their advantageous features and disadvantageous features. For example, the fusion bonding requires low forces, and may be performed at room temperature. However, since there is no electrical connection between the bonded wafers, extra electrical connections need to be made to interconnect the bonded wafers. The Eutectic bonding does not require high-quality surfaces, and hence the pre-requirement for a successful bonding is loosened. The accuracy of the eutectic bonding, however, is low, and there may be metal-squeeze problem during the eutectic bonding due to the melting of the bonding metals. The direct metal-to-metal bonding has a high accuracy. The throughput, however, is very low. In the hybrid bonding, on the other hand, the metal pads have higher Coefficients of Thermal Expansion (CTEs) than the dielectric layers at the surfaces of the bonded wafers. This results in problems for the bonding of the surface dielectric layers.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A method for bonding package components through hybrid bonding is provided in accordance with various exemplary embodiments. The intermediate stages of the bonding process are illustrated. The variations of the bonding process in accordance with the embodiments are discussed. Throughout the various views and illustrative embodiments, like reference numbers are used to designate like elements.

Figure 1:
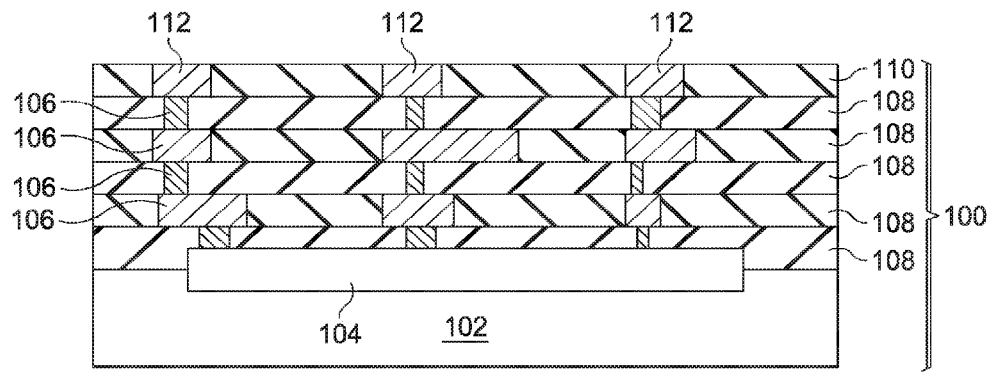
FIGS. 1 through 10 are cross-sectional views of intermediate stages in the bonding of two package components in accordance with some exemplary embodiments.

FIGS. 1 through 10 illustrate cross-sectional views of intermediate stages in a bonding process in accordance with some embodiments of the present disclosure. Referring to FIG. 1, package component 100 is illustrated. Package component 100 may comprise a device wafer, a packaged wafer, an interposer wafer, or the like. In the embodiments package component 100 comprises a device wafer, package component 100 may include semiconductor substrate 102, which may be, for example, a silicon substrate, although other semiconductor substrates such as silicon carbon substrates, silicon germanium substrates, III-V compound semiconductor substrate are also usable. Active devices 104 may be formed on a surface of substrate 102, and may include, for example, transistors. Metal lines and vias 106 are formed in dielectric layers 108, which may include Inter-Layer Dielectric (ILD), Inter-Metal Dielectric (IMD) layers, passivation layers, and the like. The ILD layer and the IMD layers may be low-k dielectric layers in some embodiments, which have dielectric constants (k values) smaller than about 3.5, smaller than about 3.0, or smaller than about 2.5. Dielectric layers 108 may also comprise non-low-k dielectric materials having dielectric constants (k values) greater than 3.9. Metal lines and vias 106 may comprise copper, aluminum, nickel, tungsten, or alloys thereof. Metal lines and vias 106 interconnect active devices 104, and may electrically connect active devices 104 to the overlying metal pads 112.

In alternative embodiments, package component 100 is an interposer wafer, which is free from active devices therein. Package component 100 may, or may not, include passive devices (not shown) such as resistors, capacitors, inductors, transformers, and the like in accordance with some embodiments.

In yet alternative embodiments, package component 100 is a package substrate. In some embodiments, package component 100 is a laminate package substrate, wherein conductive traces 106 (which are schematically illustrated) are embedded in laminate dielectric layers 108. In alternative embodiments, package components 100 are built-up package substrates, which comprise cores (not shown), and conductive traces (represented by 106) built on opposite sides of the cores. The conductive traces 106 are interconnected through conductive features in the cores.

In each of the embodiments wherein package component 100 is a device wafer, an interposer wafer, a package substrate, or the like, surface dielectric layer 110 may be formed at the surface of package component 100. In some embodiments, surface dielectric layer 110 is an oxide layer, which may comprise silicon oxide. In alternative embodiments, surface dielectric layer 110 comprises other materials such as SiON, SiN, or the like. Metal pads 112 are formed in surface dielectric layer 110, and may be electrically coupled to active devices 104 through metal lines and vias 106. Metal pads 112 may also be formed of copper, aluminum, nickel, tungsten, or alloys thereof. The top surface of surface dielectric layer 110 and the top surfaces of metal pads 112 are substantially level with each other. In the embodiments wherein package component 100 is a device wafer, surface dielectric layer 110 and metal pads 112, which are used for the subsequent bonding, may be on the front side (the side with active devices 104) or the backside of substrate 102. For example, FIG. 1 illustrates that surface dielectric layer 110 and metal pads 112 are on the front side of substrate 102.

Figure 2:
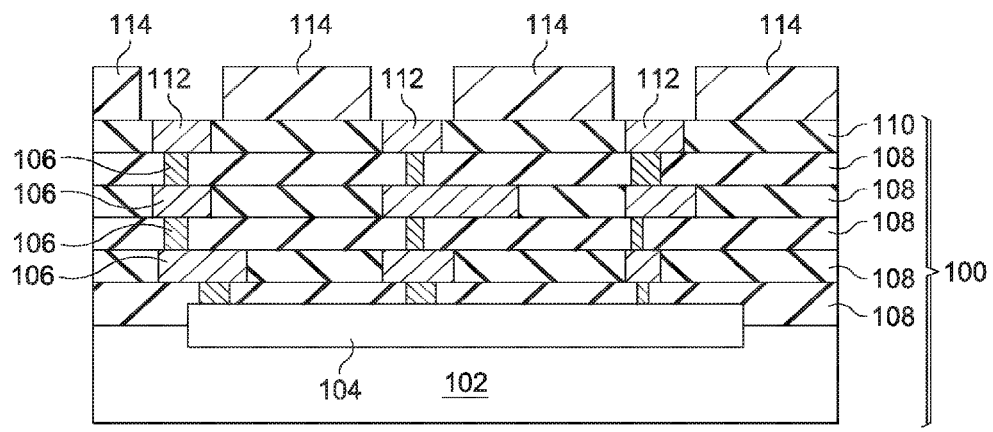

FIGS. 2-5 illustrate the photolithography processes for forming air trenches. Referring to FIG. 2, photo resist 114 is formed over package component 100, and is then patterned. The portions of surface dielectric layer 110 that encircle metal pads 112 are exposed through the openings in photo resist 114. The exposed portions of surface dielectric layer 110 may form rings encircling metal pads 112 in some exemplary embodiments. In some embodiments, metal pads 112 are also exposed, although metal pads 112 may also be covered by the remaining photo resist 114.

Figure 3:
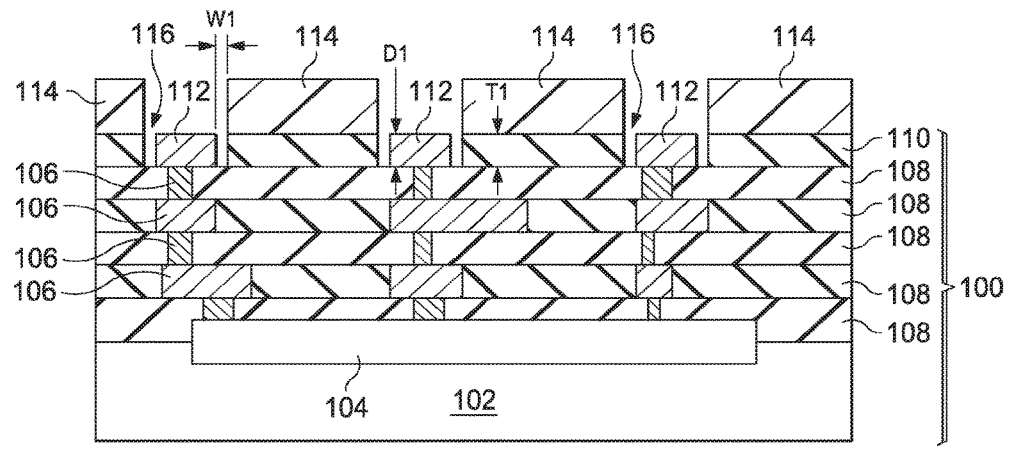

Next, as shown in FIG. 3, surface dielectric layer 110 is etched, for example, using a dry etching method. The etchant gas may be selected to attack surface dielectric layer 110, and not to attack metal pads 112. Hence, air trenches 116 are formed to encircle metal pads 112. Exemplary air trenches 116 are shown in the top view in FIG. 11. Referring back to FIG. 3, the sidewalls of metal pads 112 are exposed to air trenches 116. In addition, the sidewalls of metal pads 112 and the sidewalls of surface dielectric layer 110, which sidewalls are exposed to air trenches 116, may be substantially vertical. Depth D1 of air trenches 116 may be equal to thickness T1 of surface dielectric layer 110 in some embodiments. Alternatively, depth D1 may be greater than or smaller than thickness T1. Width W1 of air trenches 116 may be between about 0.1 μm and about 2 μm, greater than about 0.5 μm, or between about 0.5 μm and about 2 μm. It is appreciated, however, that the values recited throughout the description are merely examples, and may be changed to different values. After the etching step, photo resist 114 is removed.

Figure 4:
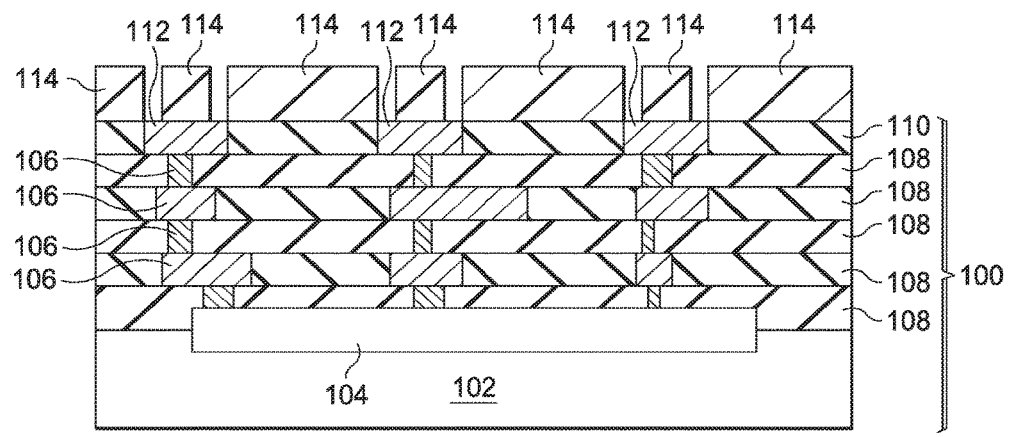
Figure 5:
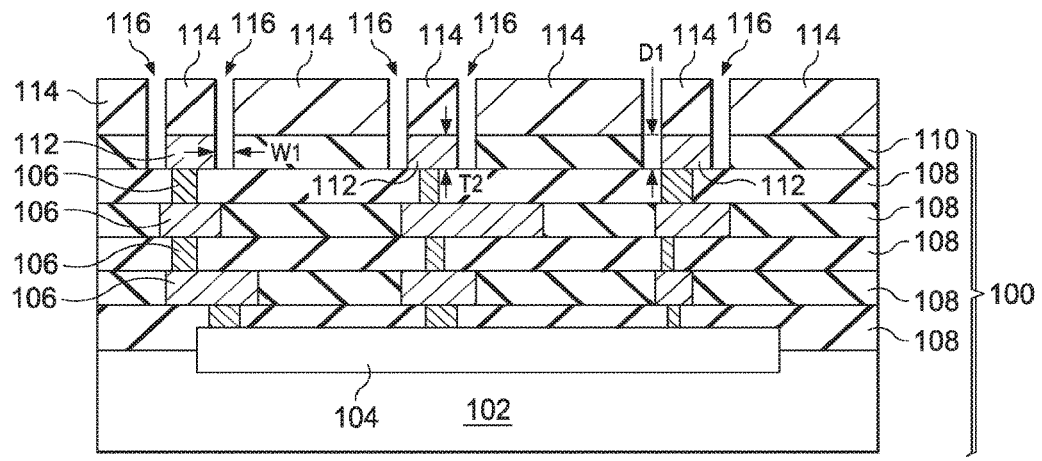

FIGS. 4 and 5 illustrate the formation of air trench 116 in accordance with alternative embodiments. These embodiments are similar to the embodiments in FIGS. 2 and 3, except that the outer portions of metal pads 112, rather than portions of surface dielectric layer 110, are etched. Referring to FIG. 4, photo resist 114 is formed and patterned. The center portions of metal pads 112 are protected by portions of photo resist 114, while the outer portions metal pads 112 are exposed. Although surface dielectric layer 110 is shown as entirely covered by photo resist 114, the openings in photo resist 114 may also extend slightly to expose some portions of surface dielectric layer 110 to allow some process margin.

Next, referring to FIG. 5, metal pads 112 are etched to form air trenches 116. The etchant gas may be selected to attack metal pads 112, and not to attack surface dielectric layer 110. Air trenches 116 may form rings encircling the remaining portions of metal pads 112, as shown in the top view in FIG. 11 in some embodiments. As shown in FIG. 5, the sidewalls of the remaining metal pads 112 are exposed to air trenches 116. Depth D1 of air trenches 116 may be equal to thickness T2 of metal pads 112 in some embodiments. Alternatively, depth D1 may be greater than or smaller than thickness T2. Width W1 of air trenches 116 may be between about 0.1 μm and about 2 μm, greater than about 0.5 μm, or between about 0.5 μm and about 2 μm. After the etching step, photo resist 114 is removed.

Figure 6:
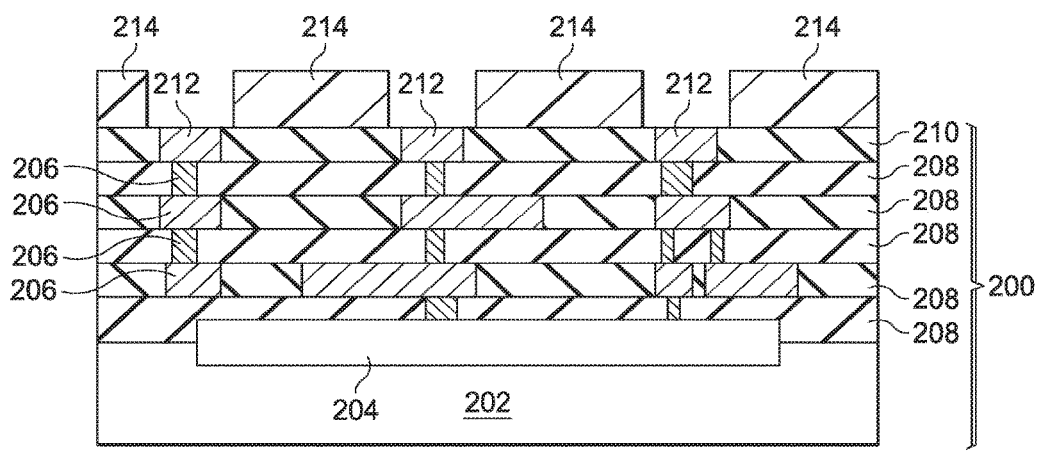

FIG. 6 illustrates package component 200, which is to be bonded to package component 100. Package component 200 may also be selected from a device wafer, an interposer wafer, a package substrate, and the like. In the illustrated FIG. 2, package component 200 includes substrate 202, active devices 204, dielectric layers 208, metal lines and vias 206 in dielectric layers 208, surface dielectric layer 210, and metal pads 212. Package component 200 may have a structure similar to what is described for package component 100, and the details are not repeated herein. The materials of the features in package component 200 may be found referring to the like features in package component 100, with the like features in package component 100 starting with number "1," which features correspond to the features in package component 200 and having reference numerals starting with number "2."

Figure 7:
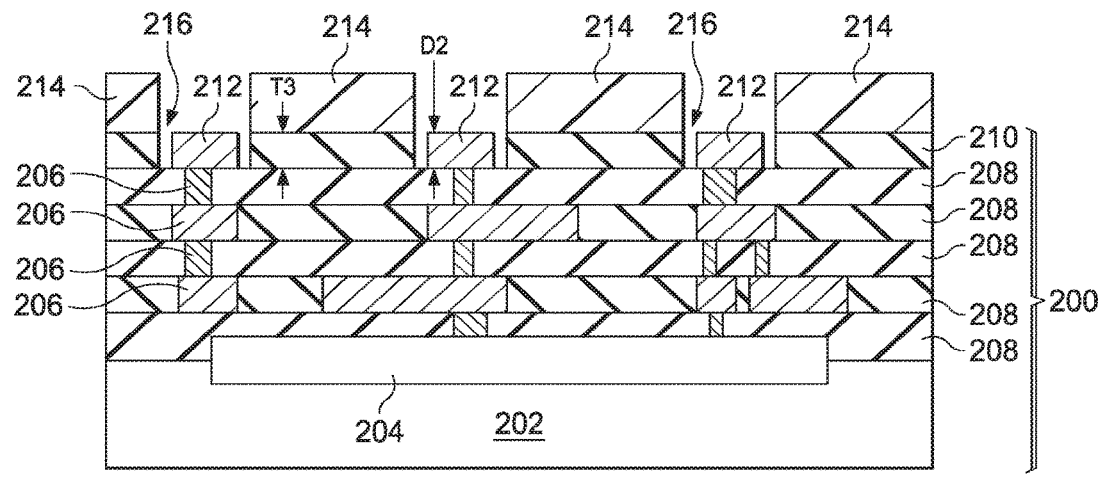

FIGS. 6 and 7 also illustrate the formation of air trenches 216 in accordance with various embodiments. The processes are essentially the same as in FIGS. 2 and 3, and hence some of the details may not be repeated herein. Referring to FIG. 6, photo resist 214 is formed, wherein portions of surface dielectric layer 210 are exposed through the openings in photo resist 214. Metal pads 212 may also be exposed, although they may be covered in alternative embodiments.

Next, as shown in FIG. 7, surface dielectric layer 210 is etched, for example, using a dry etching method. The etchant gas may be selected to attack surface dielectric layer 210, and not to attack metal pads 212. Hence, air trenches 216 are formed to encircle metal pads 212. Air trenches 216 may form rings encircling metal pads 212, as shown in the top view in FIG. 11. As shown in FIG. 7, the sidewalls of metal pads 112 are exposed to air trenches 216. Depth D2 of air trenches 216 may be equal to thickness T3 of surface dielectric layer 210 in some embodiments. Alternatively, depth D2 may be greater than or smaller than thickness T3. Width W2 of air trenches 116 may be essentially the same as width W1 (FIG. 3). After the etching step, photo resist 214 is removed.

Figure 8:
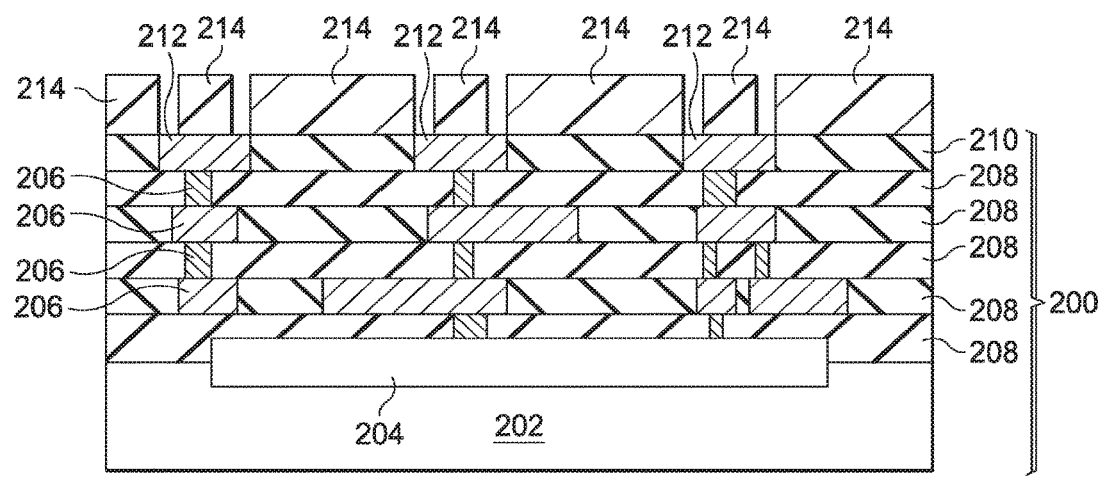
Figure 9:
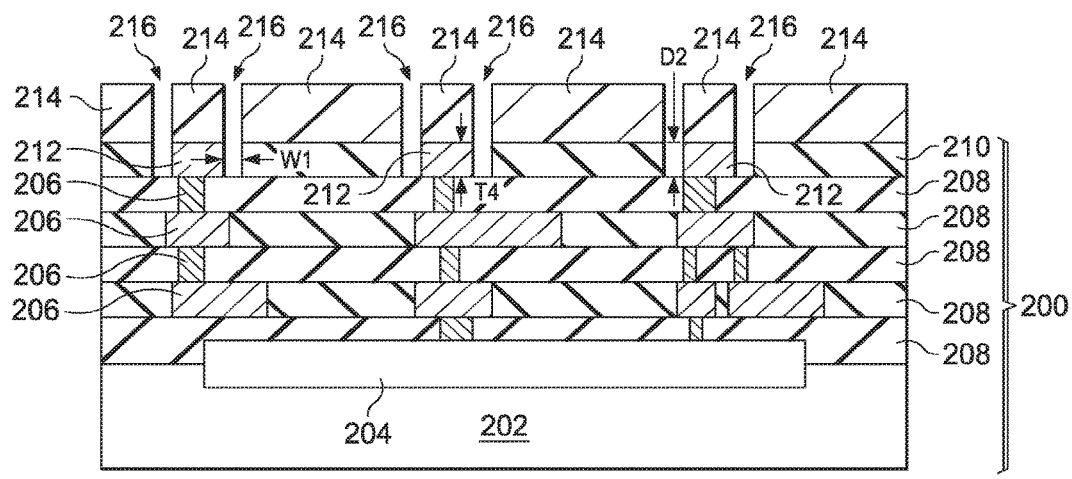

FIGS. 8 and 9 illustrate the etching of metal pads 212 to form air trenches 216 in accordance with alternative embodiments. These embodiments are similar to the embodiments in FIGS. 4 and 5. Referring to FIG. 8, photo resist 214 is formed and patterned. The center portions of metal pads 212 are protected by a portion of photo resist 214, while the outer portions are exposed. Although surface dielectric layer 210 is shown as covered by photo resist 214, the openings in photo resist 214 may also extend slightly to expose some portions of surface dielectric layer 210 to allow some process margin.

Next, referring to FIG. 9, metal pads 212 are etched to form air trenches 216. The etchant gas may be selected to attack metal pads 212, and not to attack surface dielectric layer 210. Air trenches 216 may form rings encircling the remaining portions of metal pads 212, as shown in the top view in FIG. 11. As shown in FIG. 9, the sidewalls of the remaining metal pads 212 are exposed to air trenches 216. Depth D2 of air trenches 216 may be equal to thickness T4 of metal pads 212 in some embodiments. Alternatively, depth D2 may be greater than or smaller than thickness T4.

Width W1 of air trenches 216 may be essentially the same as width W1 (FIG. 5). After the etching step, photo resist 214 is removed.

Figure 10:
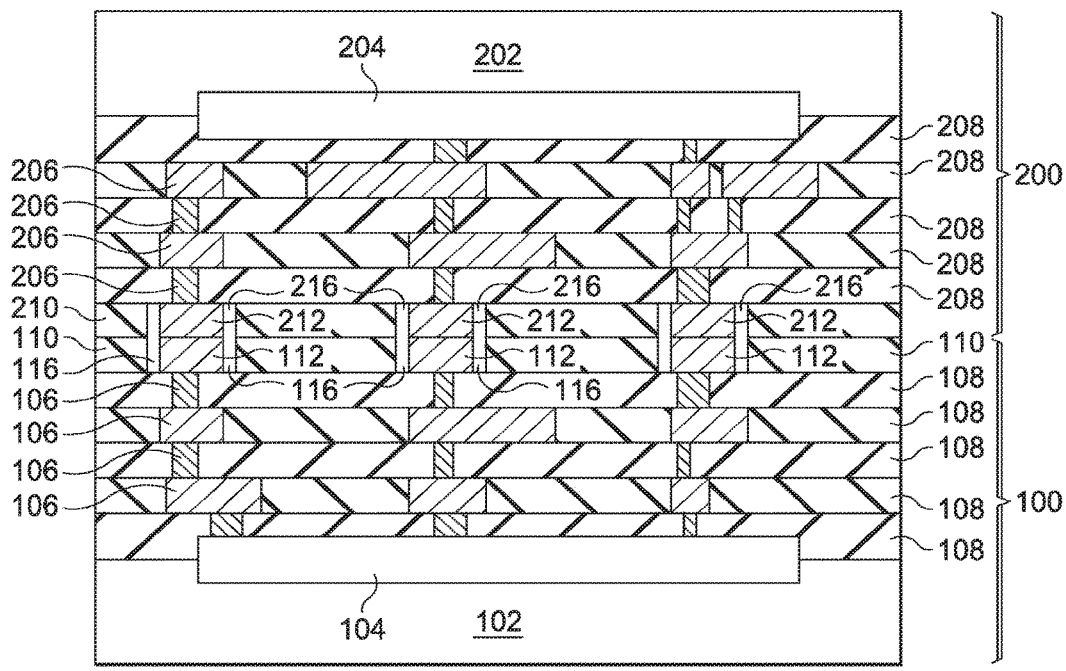

Next, as shown in FIG. 10, package components 100 and 200 are pre-bonded. In the pre-bonding, package components 100 and 200 are first aligned, with bond pads 112 of package component 100 aligned to bond pads 212 of package component 200. After the alignment, package components 100 and 200 are pressed against each other. During the pre-bonding, a small pressing force may be applied to press package components 100 and 200 against each other, which pressing force may be lower than about 5 Newton per die, for example. The pre-bonding may be performed at the room temperature (for example, between about 21° C. to about 25° C.), although higher temperatures may be used. The bonding time may be shorter than about 1 minute, for example.

After the pre-bonding, surface dielectric layer 110 and 210 are bonded to each other. The bonding strength, however, needs to be improved in a subsequent annealing step. The bonded package components 100 and 200 may be annealed at a temperature between about 300° C. and about 400° C., for example. The annealing may be performed for a period of time between about 1 hour and 2 hours. When temperature rises, the OH bond in surface dielectric layers 110 and 210 break to form strong Si—O—Si bonds, and hence package components 100 and 200 are bonded to each other through fusion bonds (and through Van Der Waals force). In addition, during the annealing, the copper in metal pads 112 and 212 diffuse to each other, so that metal-to-metal bonds are also formed. Hence, the resulting bonds between package components 100 and 200 are hybrid bonds. After the bonding, the bonded package components 100 and 200 are sawed into packages, with the portions of package components 100 and 200 in the packages comprising dies.

As shown in FIG. 10, air trenches 116 and 216 may be aligned to each other, and are interconnected to form continuous air trenches extending from package component 100 into package component 200. Furthermore, the integrated air trenches 116 and 216 encircle the bonded metal pads 112 and 212.

Figure 11:
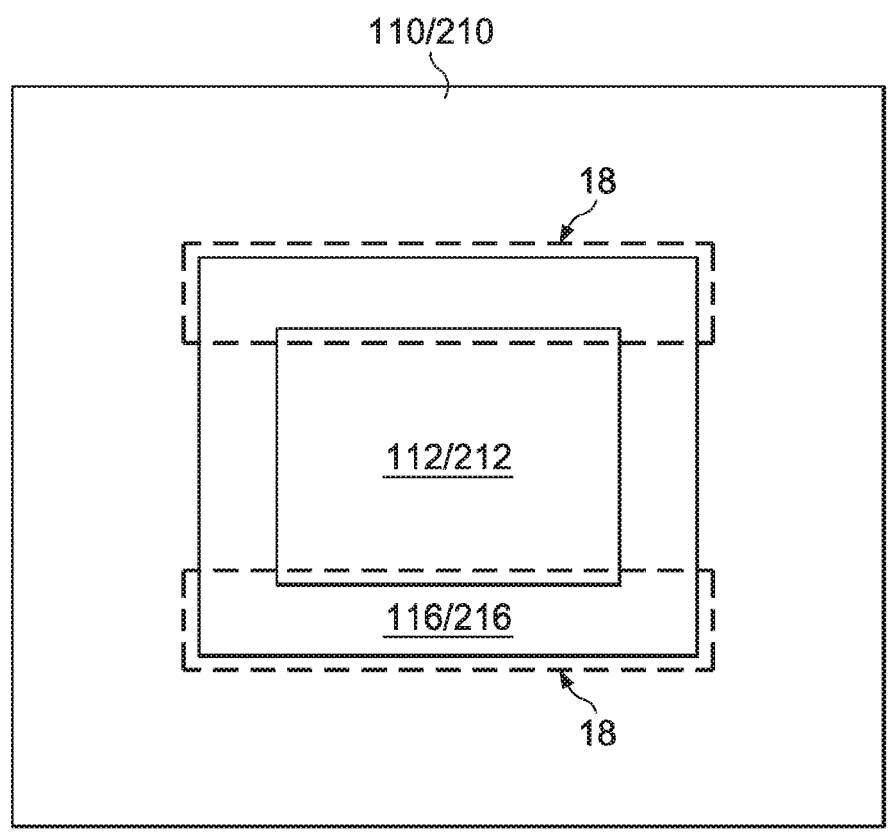
FIG. 11 illustrates a top view of the bonded metal pads, bonded surface dielectric layers, and air trenches in accordance with some embodiments.

FIG. 11 illustrates a top view showing air trenches 116 and 216 are overlapped, and metal pads 112 and 212 are stacked. It is appreciated that although the term "air trench" is used, trenches 116 and 216 are not necessarily filled with air. Depending on the environment in which the pre-bonding and annealing is performed, trenches 116 and 216 may be vacuumed, or may be filled with other types of gases such as nitrogen. In some embodiments, as illustrated in FIG. 11, air trenches 116 and 216 encircle bonded metal pads 112 and 212. In other embodiments, air trenches 116 and 216 do not extend into regions 18. Hence, air trenches 116 and 216 may be formed on the opposite sides of metal pads 112 and 212, and do not form rings in these embodiments.

In the embodiments of the present disclosure, due to the formation of air trenches, free spaces are generated around the bonded metal pads. During the annealing process, the metal pads expand more than the surface dielectric layers since their Coefficient of Thermal Expansion (CTE) is greater than the CTE of the surface dielectric layers. Without the air trench, the expanded metal pads apply stresses to the surrounding dielectric layers, and hence cause damage to the fusion bonds of the surrounding dielectric layers. With the air trenches, free spaces are created to allow the metal pads to expand freely without applying stresses on the surrounding dielectric layers, and hence the surrounding dielectric layers may have good fusion bonds formed.

In accordance with some embodiments, a package component includes a surface dielectric layer including a planar top surface, a metal pad in the surface dielectric layer and including a second planar top surface level with the planar top surface, and an air trench on a side of the metal pad. The sidewall of the metal pad is exposed to the air trench.

In accordance with other embodiments, a method includes performing a photo lithography process on a first package component to form an air trench in a first surface dielectric layer of the first package component. The air trench encircles a first metal pad in the first surface dielectric layer. The method further includes bonding the first package component to a second package component. The first metal pad is bonded to a second metal pad of the second package component. The first surface dielectric layer is bonded to a second surface dielectric layer of the second package component.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
    a first package component comprising:
        a first surface dielectric layer;
        a first metal pad in the first surface dielectric layer; and
        a first air trench, wherein a first sidewall of the first metal pad is exposed to the first air trench; and
    a second package component over and bonded to the first package component, wherein the second package component comprises:
        a second surface dielectric layer; and
        a second metal pad in the second surface dielectric layer, wherein the second package component comprises a portion exposed to the first air trench.

2. The package of claim 1, wherein the first sidewall of the first metal pad is aligned to a second sidewall of the second metal pad, and the first air trench extends into the second package component, with the second sidewall exposed to the first air trench.

3. The package of claim 1, wherein the first air trench extends to a bottom surface of the first surface dielectric layer.

4. The package of claim 1, wherein the first air trench extends to an intermediate level between a top surface and a bottom surface of the first surface dielectric layer.

5. The package of claim 1, wherein the first air trench forms a trench ring encircling the first metal pad.

6. The package of claim 1 further comprising a second air trench, wherein the first air trench and the second air trench are on opposite sides of the first metal pad, and the first air trench and the second air trench are disconnected from each other.

7. The package of claim 1, wherein the first air trench has a width greater than about 0.5 µm.

8. A package comprising:
a first package component comprising:
a first surface dielectric layer;
a first metal pad in the first surface dielectric layer;
a first air trench with a portion on a side of the first metal pad, wherein a sidewall of the first metal pad is exposed to the first air trench; and
a second package component over and bonded to the first package component, wherein the second package component comprises:
a second surface dielectric layer;
a second metal pad in the second surface dielectric layer, wherein the first metal pad is bonded to the second metal pad; and
a second air trench with a portion on a side of the second metal pad, wherein a sidewall of the second metal pad is exposed to the second air trench.

9. The package of claim 8, wherein the first air trench is joined to the second air trench.

10. The package of claim 8, wherein the first air trench forms a ring encircling the first metal pad, and all sidewalls of the first metal pad are exposed to the first air trench.

11. The package of claim 8, wherein the first package component further comprises a third air trench, wherein the first air trench and the third air trench are on opposite sides of the first metal pad, and the first air trench and the third air trench are disconnected from each other.

12. The package of claim 11, wherein in a top view of the package, the first air trench has a length greater than a respective length of the first metal pad.

13. The package of claim 8, wherein the first air trench extends to a bottom surface of the first surface dielectric layer.

14. The package of claim 8, wherein the first air trench extends to an intermediate level between a top surface and a bottom surface of the first surface dielectric layer.

15. A package comprising:
a first package component comprising:
a first surface dielectric layer;
a first metal pad in the first surface dielectric layer, wherein a top surface of the first surface dielectric layer and a top surface of the first metal pad are coplanar;
a first air trench with a first portion on a first side of the first metal pad, wherein a first sidewall of the first metal pad is exposed to the first air trench; and
a second air trench with a second portion on a second side of the first metal pad, wherein a second sidewall of the first metal pad is exposed to the second air trench, and the first sidewall and the second sidewall are opposite sidewalls of the first metal pad.

16. The package of claim 15, wherein the first air trench and the second air trench are discrete air trenches separated from each other.

17. The package of claim 15, wherein the first air trench has a length greater than a respective length of the first sidewall of the first metal pad, and the first air trench extends beyond an end of the first sidewall.

18. The package of claim 15 further comprising a second package component over and bonded to the first package component, wherein the second package component comprises:
a second surface dielectric layer;
a second metal pad in the second surface dielectric layer, wherein the first metal pad is bonded to the second metal pad; and
a third air trench with a third portion on a side of the second metal pad, wherein a third sidewall of the second metal pad is exposed to the third air trench.

19. The package of claim 18, wherein the first air trench is joined to the third air trench.

20. The package of claim 18, wherein the second package component further comprises:
a fourth air trench with a fourth portion on a side of the second metal pad, wherein a fourth sidewall of the second metal pad is exposed to the fourth air trench, and the third air trench and the fourth air trench are separated from each other, and the fourth air trench is joined to the second air trench.

* * * * *